United States Patent
Cheng et al.

(10) Patent No.: US 11,244,854 B2
(45) Date of Patent: Feb. 8, 2022

(54) DUAL DAMASCENE FULLY ALIGNED VIA IN INTERCONNECTS

(71) Applicant: International Business Machines Corporation, Armonk, NY (US)

(72) Inventors: Kenneth Chun Kuen Cheng, Albany, NY (US); Koichi Motoyama, Clifton Park, NY (US); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/828,088

(22) Filed: Mar. 24, 2020

(65) Prior Publication Data

US 2021/0305090 A1   Sep. 30, 2021

(51) Int. Cl.
*H01L 21/768* (2006.01)
*H01L 23/522* (2006.01)

(52) U.S. Cl.
CPC .. *H01L 21/76808* (2013.01); *H01L 21/76813* (2013.01); *H01L 21/76831* (2013.01); *H01L 23/5226* (2013.01)

(58) Field of Classification Search
CPC ......... H01L 21/76807; H01L 21/76813; H01L 21/768; H01L 21/16801; H01L 21/76802; H01L 21/76829; H01L 21/76832; H01L 21/76834
See application file for complete search history.

(56) References Cited

U.S. PATENT DOCUMENTS

| | | | |
|---|---|---|---|
| 6,235,628 B1 | 5/2001 | Wang et al. |
| 6,917,108 B2 | 7/2005 | Fitzsimmons et al. |
| 9,324,650 B2 | 4/2016 | Edelstein et al. |
| 9,806,023 B1 | 10/2017 | Briggs et al. |
| 9,953,865 B1 | 4/2018 | Briggs et al. |
| 10,256,191 B2 | 4/2019 | Briggs et al. |
| 2009/0072400 A1 | 4/2009 | Zhu et al. |

(Continued)

OTHER PUBLICATIONS

Briggs, Benjamin D. et al., Fully Aligned Via Integration for Extendibility of Interconnects to Beyond the 7 nm Node; IEEE 2017, pp. 14.2.1 to 14.2.4.

*Primary Examiner* — Thanhha S Pham
(74) *Attorney, Agent, or Firm* — L. Jeffrey Kelly; Otterstedt, Wallace & Kammer, LLP

(57) ABSTRACT

Dual damascene interconnect structures with fully aligned via integration schemes are formed using different dielectric materials having different physical properties. A low-k dielectric material having good fill capabilities fills nanoscopic trenches in such structures. Another dielectric material forms the remainder of the dielectric portion of the interconnect layer and has good reliability properties, though not necessarily good trench filling capability. The nanoscopic trenches may be filled with a flowable polymer using flowable chemical vapor deposition. A further dielectric layer having good reliability properties is deposited over the metal lines and dual damascene patterned to form interconnect line and via patterns. The patterned dielectric layer is filled with interconnect metal, thereby forming interconnect lines and fully aligned via conductors. The via conductors are electrically connected to previously formed metal lines below.

14 Claims, 7 Drawing Sheets

(56) References Cited

U.S. PATENT DOCUMENTS

| | | |
|---|---|---|
| 2017/0053863 A1* | 2/2017 | Lu .................... H01L 21/76879 |
| 2018/0315654 A1 | 11/2018 | Briggs et al. |
| 2019/0019726 A1 | 1/2019 | Ryan et al. |
| 2019/0326170 A1 | 10/2019 | Backes et al. |
| 2019/0385910 A1 | 12/2019 | Lai et al. |

* cited by examiner

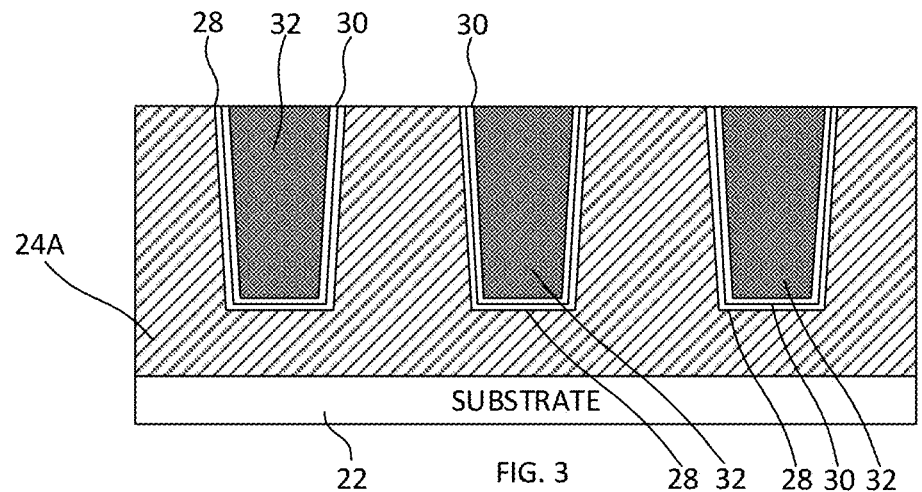
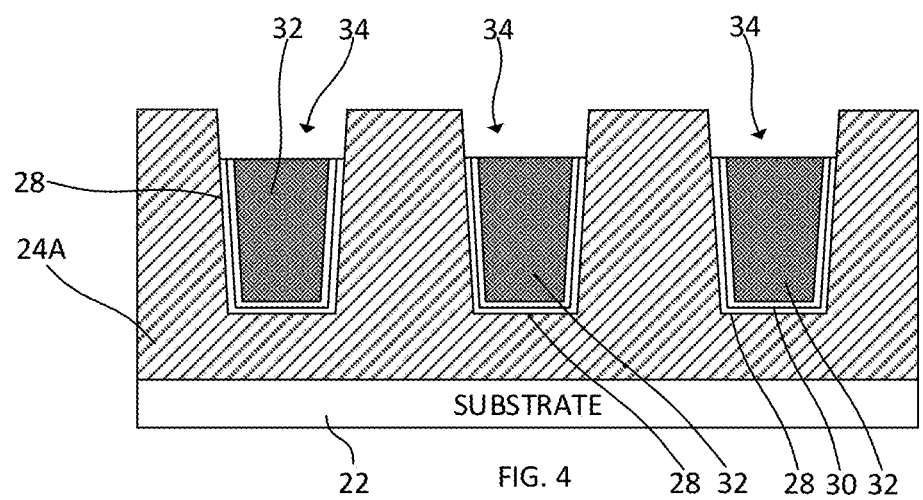

DUAL DAMASCENE FULLY ALIGNED VIA IN INTERCONNECTS

BACKGROUND

The present invention relates generally to the electrical, electronic and computer arts and, more particularly, to dual damascene fully aligned via (FAV) interconnects.

Silicon-based devices typically include multiple interconnect metallization layers above a device (front-end-of-line/ FEOL) layer that contains field-effect transistors (FETs) or other structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing includes intermediate-temperature steps for forming semiconductor-metal compounds (silicides, germanosilicides) for electrical contacts. Back-end-of-line (BEOL) processing involves the creation of metal interconnecting wires that connect the devices formed in FEOL processing to form electrical circuits. The metal lines including the interconnecting wires are deposited in sequence (e.g. M1, M2, M3, etc.) above the FEOL layer and include dielectric layers comprising trenches and vias therein that are filled with electrical conductors. Trench openings are conventionally formed in the dielectric layer by using, for example, known damascene or dual damascene techniques. M2 and M3 lines may have wider pitches than the M1 line. The interconnecting wires within each metal line are electrically connected to interconnecting wires in other metal lines and to the devices in the FEOL layer. BEOL processing includes low-temperature steps for forming metal wires and preserving temperature sensitive FEOL and MOL structures. Narrow metal lines are required for some applications.

BEOL processing involves the formation of interconnects above the MOL layers. A chip may have multiple BEOL interconnect layers. Each layer, which has a wiring scheme, is connected to another layer by vias. Damascene copper wires are often chosen to reduce the wire resistance due to superior electrical conductivity of copper. The wires are formed within dielectric layers comprising low-k material. The dual-damascene process is characterized by patterning vias and trenches such that the metal deposition fills both at the same time. FAVs can enable relatively small BEOL pitch, for example 32 nm or less and may be effective to reduce via resistance by maximizing the contact area between the via and the metal line below. Enhanced Vbd (breakdown voltage) is expected due to increased distance between a via and an adjacent line.

BRIEF SUMMARY

Dual damascene interconnects with fully aligned vias are formed using flowable, low-k dielectric material in nanoscopic trench portions of an interconnect layer and different low-k dielectric material(s) having superior reliability in other portions of the interconnect layer.

A method of forming an interconnect layer over a semiconductor substrate is provided. A bottom structure including a first dielectric layer is obtained. The first dielectric layer includes a first low-k dielectric material above the semiconductor substrate and metal lines within the first dielectric layer. The metal lines are recessed, thereby forming open-ended trenches within the first dielectric layer and directly above the metal lines. The open-ended trenches are filled with a second low-k dielectric material. The second low-k dielectric material and the first low-k dielectric material have one or more different physical properties, such as different dielectric breakdown properties. A top dielectric layer is formed over the bottom structure and patterned. Patterning of the top dielectric layer includes forming one or more top trenches within the top dielectric layer and one or more vias extending downwardly from each of the one or more top trenches, the one or more vias being vertically aligned with one or more portions of the open-ended trenches. The second low-k dielectric material is removed from the one or more portions of the open-ended trenches. Interconnect metal is deposited within the one or more top trenches, the one or more vias, and the one or more portions of the open-ended trenches. The interconnect metal within the vias is electrically connected to one or more of the metal lines.

A further method of fabricating an interconnect layer includes recessing a plurality of metal lines within a first dielectric layer comprising a first low-k dielectric material, thereby forming recessed metal lines and a plurality of open-ended trenches extending, respectively, within the first dielectric layer above the metal lines. A dielectric cap/etch stop layer is conformally deposited over the first dielectric layer and the recessed metal lines. The method further includes flowing a second low-k dielectric material over the dielectric cap/etch stop layer, thereby forming a second dielectric layer filling the open-ended trenches. The second low-k dielectric material is a flowable dielectric. The second low-k dielectric material and the first low-k dielectric material have one or more different physical properties. The second dielectric layer is planarized, thereby removing the second dielectric material above the open-ended trenches. A third dielectric layer is deposited over the second dielectric layer and the cap/etch stop layer and is dual damascene patterned, thereby forming one or more top trenches and vias extending downwardly from the one or more top trenches. Portions of the second dielectric layer beneath the vias are removed. Further steps include removing one or more portions of the dielectric cap/etch stop layer beneath the vias and depositing interconnect metal within the one or more top trenches, the vias, and one or more of the open-ended trenches, the interconnect metal being electrically connected to one or more of the recessed metal lines.

In a further aspect of the invention, an electronic structure includes a semiconductor substrate, a first dielectric layer over the semiconductor substrate and comprising a first low-k dielectric material, and metal lines recessed within the first dielectric layer. A plurality of open-ended trenches extend, respectively, within the first dielectric layer and directly above the metal lines. A second low-k dielectric material fills one or more portions of the plurality of open-ended trenches. The second low-k dielectric material and the first low-k dielectric material have one or more different physical properties. The electronic structure further includes a dual damascene patterned third dielectric layer extending over the first dielectric layer and the second low-k dielectric material. The third dielectric layer includes vertically extending vias aligned with one or more of the metal lines. A metal interconnect layer within the third dielectric layer extends through the vertically extending vias and is electrically connected to one or more of the metal lines.

Techniques and structures as disclosed herein can provide substantial beneficial technical effects. By way of example only and without limitation, one or more embodiments may provide one or more of the following advantages:

Improvement in TDDB (time dependent dielectric breakdown) properties;

Reduction in via resistance using FAVs;

Facilitate use of different types of dielectric materials and dielectric materials having different properties in levels of an interconnect structure.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3 is a schematic, cross-sectional view showing the structure of FIG. 2 following planarization of the metal fill layer;

FIG. 4 is a schematic, cross-sectional view thereof following recessing of the metal fill layer;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Dual damascene interconnects with fully aligned vias (FAVs) can minimize alignment issues and improve reliability, for example TDDB (time dependent dielectric breakdown) and performance. Fully aligned via integration schemes may require use of a flowable low-k dielectric material. The relatively poor reliability of such material compared to nonconformally deposited dielectric materials can, however, offset the reliability benefits that FAV structures provide. As FAV structures have nanoscopic dimensions, low-k dielectric materials with excellent fill capabilities are typically necessary. A structure or space having nanoscopic dimensions, such as a via or trench, includes one or more dimensions less than one hundred nanometers. The height and width of trenches in interconnect structures can both be less than one hundred nanometers. The reliability of FAV interconnects is generally governed by the properties of the dielectric material between metal lines. A dual damascene FAV structure having improved reliability is obtained by employing a flowable dielectric material to fill the nanoscopic trenches while low-k dielectric materials with better TDDB properties fills the gaps between the metal line/vias thereof.

Figure 1:
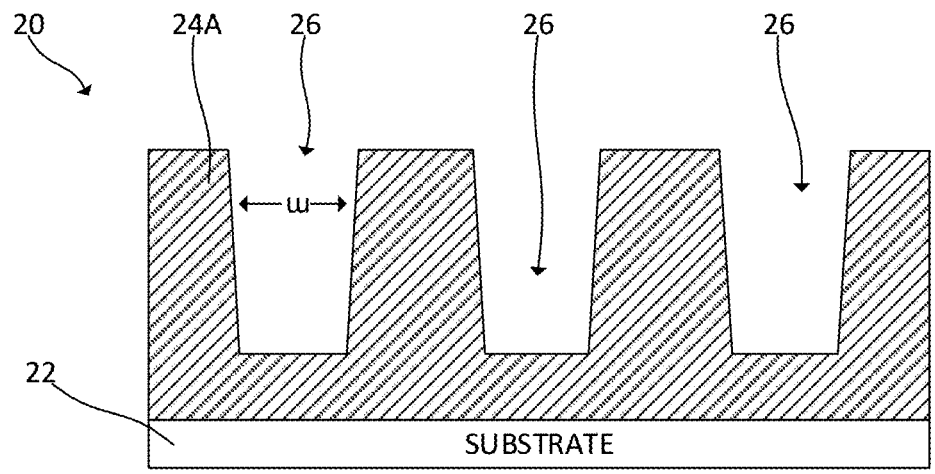
FIG. 1 is a schematic, cross-sectional view showing a patterned interlayer dielectric layer formed over a device wafer.

A monolithic structure 20 shown in FIG. 1 is obtained following FEOL processing and formation of a patterned interlevel dielectric (ILD) layer 24A over a substrate 22. Interconnect line/via patterns are conventionally formed in the ILD layer 24A by using, for example, known damascene techniques. A patterning stack including hard masks and lithographic masks is formed on the ILD layer followed by etching steps. Specifically, a photoresist (not shown) may be applied over the ILD layer. The photoresist can be applied by any suitable technique, including, but not limited to coating or spin-on techniques. A mask (not shown), which is patterned with shapes defining trench openings and/or possibly vias to be formed, is provided over the photoresist, and the mask pattern is transferred to the photoresist using a photolithographic process, which creates recesses in the uncovered regions of the photoresist. The patterned photoresist is subsequently used to create the same pattern of trenches 26 in the ILD layer through conventional etching typically used for forming trenches and contact holes. Dry etch (for example, a reactive ion etch) techniques may be employed to form such horizontally extending trenches and vias (not shown in FIG. 1) extending vertically downwardly from the trenches. The etching selectively removes a portion of the ILD layer 24A. The depth(s) of the trench openings or other holes can be controlled by using a timed etching process. Alternatively, the dielectric layer 24A may include multiple layers that may be selectively etched. In such a case, the etch process selectively removes the upper layer(s) of the ILD layer, stopping at a lower layer thereof that forms an etch stop. After formation of trench openings and/or vias, the photoresist may be stripped by ashing or other suitable process from the ILD layer. The resulting structure 20 may be subjected to a wet clean. In an exemplary embodiment, the trenches 26 have average width dimensions (w) of 50 nm or less. In a further exemplary embodiment, the trenches have an average width of 18 nm or less. The sidewalls of the trenches 26 may converge inwardly from top to bottom.

The ILD layer 24A may be deposited on the substrate 22 using, for example, deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layer 24A may include, but is not limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. The ILD layer 24A may have a vertical thickness ranging from about 20 nm to about 200 nm. An SiCOH dielectric film having a dielectric constant (k) of about 2.7-2.8 can, for example, comprise the ILD layer. Such a dielectric film can be deposited using PECVD. The dielectric material chosen for the ILD layer 24A, for example SiCOH, should exhibit satisfactory time dependent dielectric breakdown (TDDB) reliability. Time dependent dielectric breakdown involves the loss of insulating properties of a dielectric when it its subjected to voltage/current bias and temperature stress. It may be indicated by an increase in the leakage current when under constant bias stress at elevated temperature. Various tests are known for determining the reliability of low-k dielectrics such as carbon doped silicon oxide.

A further stage in the fabrication process includes depositing conformal layer(s) of liner material(s) on the patterned dielectric layer 24A. The sidewalls and bottom surfaces of the trenches 26 and/or other openings within the ILD layer 24A are lined with layer(s) of electrically conductive materials. The liner material may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB which are suitable for the given application. The thin liner serves as a barrier diffusion layer and adhesion layer. The conformal layer of liner material is deposited using known techniques such as CVD, ALD, or PVD.

Figure 2:
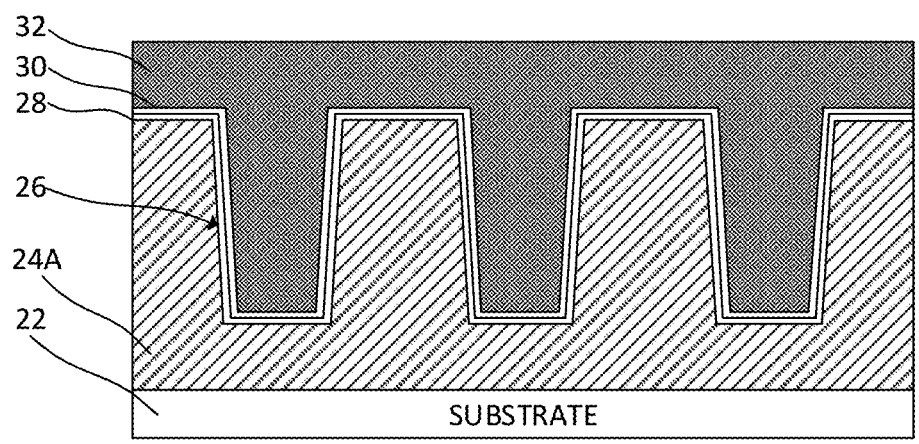
FIG. 2 is a schematic, cross-sectional view showing the structure of FIG. 1 following deposition of a barrier, a metal liner and a metal fill layer.

In an exemplary embodiment, a barrier layer 28 including TaN or TiN is deposited directly on the ILD layer 24A and a metal liner 30 comprising cobalt or ruthenium is deposited on the barrier layer 28. A thin conformal copper (Cu) seed layer can be deposited over the surface of the metal liner using PVD, followed by the electroplating of Cu to fill the damascene (or dual damascene) openings in the ILD layer 24A, including the trenches 26 in the exemplary structure depicted in FIG. 1. A thermal anneal stage follows electroplating. In one example, cobalt is present in thin layers as a metal liner layer (e.g., 1 to 100 angstroms) between a TaN barrier layer and a Cu fill layer. An exemplary structure including a barrier layer 28, a metal liner 30 and a metal fill layer 32 is schematically illustrated in FIG. 2. The deposited layers 28, 30, 32 form metal lines that extend horizontally within the first ILD layer 24A. The metal lines may be electrically connected to electronic devices (not shown) formed on the semiconductor substrate 22 or to intermediate wiring layers (not shown).

The overburden barrier, liner, seed, and metallization materials may then be removed by performing a multi-step chemical mechanical polishing process (CMP) to planarize the surface of the semiconductor structure down to the ILD layer 24A to obtain a structure as illustrated in FIG. 3. Referring to FIG. 4, portions of the metal fill layer 32 are recessed using, for example, SC1/dHF (diluted hydrofluoric acid). As an alternative to using SC1/dHF, the metal fill layer 32 may recessed by wet etches, including chemistries having an oxidizer such as, for example, hydrogen peroxide. Portions of the metal liner 30 can be removed at the same time as the metal fill layer. Recesses 34 in the metal form relatively shallow, nanoscopic trenches (compared to the originally formed trenches 26) in the ILD layer 24A above the top surfaces of the recessed metal. The shallow, nanoscopic trenches 34 have about one quarter to one third the depth of the trenches 26 formed in the ILD layer 24A in some exemplary embodiments. Such depth dimensions are not considered critical and may, for example, be in the range of five percent to seventy percent of the depth of the originally formed trenches 26.

The metal fill layer 32 is recessed selective to the barrier layer and to the ILD layer 24A. Referring to FIG. 4, after recessing of the metal fill layer and removal of the adjoining top portions of the metal liner 30, exposed portions of the barrier layer 28 (e.g., TaN) can be removed The removal of the barrier layer 28 is selective to the metal fill layer 32 and the dielectric layer 24A. According to an embodiment of the present invention, the barrier layer is selectively etched using, for example, 15% $H_2O_2$ (hydrogen peroxide)+10 g/L (grams/liter) BTA (Benzotriazole)+0.5 g/L CDTA (cyclohexanediamininetetraaceticacid)+KOH (potassium hydroxide) in deionized (DI) water at a pH in the range of about 4 to about 12. Etching can be performed at a temperatures ranging from about 25 degrees C. to about 70 degrees C. Other possible variations for etch chemistry include, but are not necessarily limited to replacing KOH by another alkaline metal hydroxide, replacing hydrogen peroxide by another compound containing one or more peroxy groups, replacing CDTA by another peroxide stabilizer, and/or replacing BTA by another corrosion inhibitor.

Figure 5:
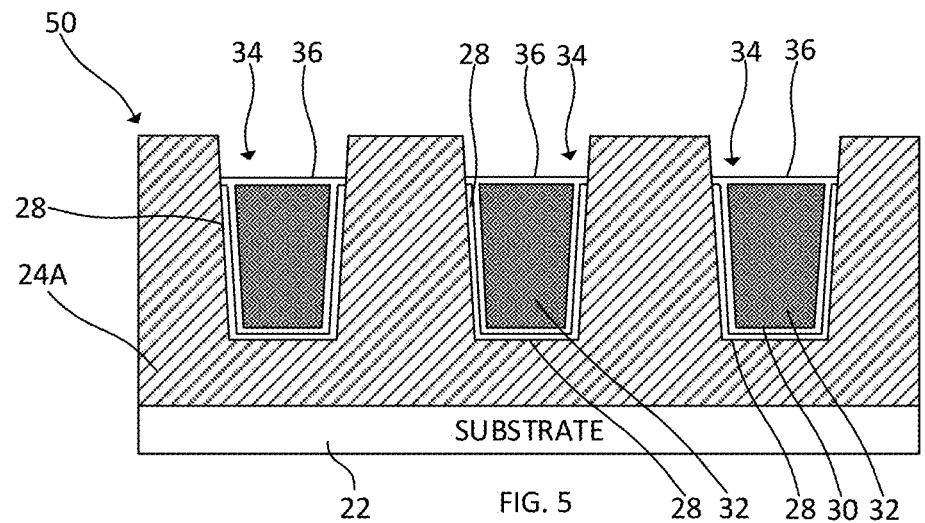
FIG. 5 is a schematic, cross-sectional view thereof following deposition of optional metal caps on the metal fill layer.

Optionally, a metal cap layer may be selectively deposited on the exposed top surfaces of metal interconnect lines within the trenches. Metals such as cobalt, ruthenium or manganese may be deposited using chemical vapor deposition or atomic layer deposition to form the metal cap layers. Post-deposition cleaning may be required to ensure there is no leakage or degradation resulting from possible metal residues on the resulting structure. A structure 50 as illustrated in FIG. 5 includes metal caps 36 on the recessed metal lines may be obtained following selective deposition of the metal cap layer. Recesses (shallow trenches) 34 within the dielectric layer 24A remain above the metal caps 36.

Figure 6:
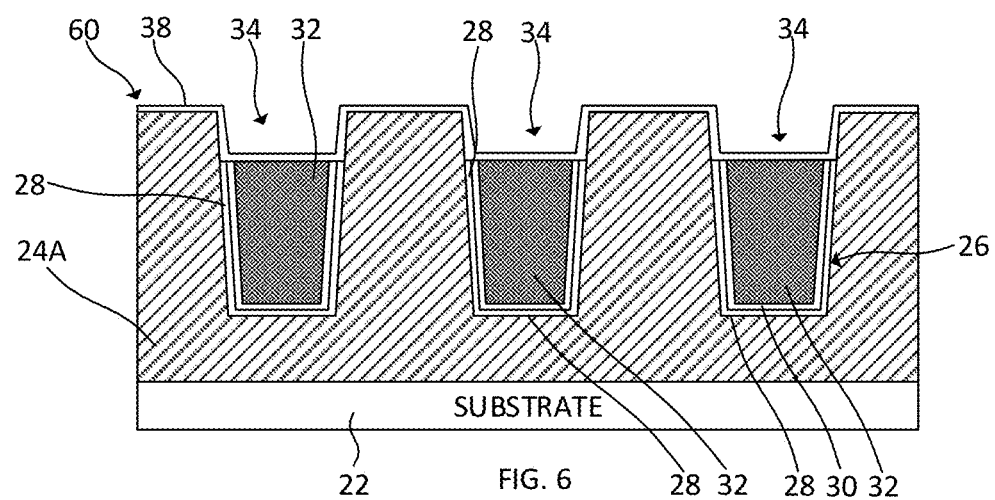
FIG. 6 is a schematic, cross-sectional view showing the structure of FIG. 4 following deposition of a conformal, dielectric cap/etch stop layer.

Referring to FIG. 6, a dielectric cap/etch stop layer 38 is formed on the structure shown in FIG. 4 or FIG. 5. The exemplary structure 60 is shown without the optional metal caps 36 described above with respect to FIG. 5. The cap/etch stop layer may be conformally deposited using a suitable deposition technique, such as, for example, CVD, PECVD, RFCVD, PVD, ALD, MBD, PLD, and/or LSMCD, sputtering, and/or plating on the top and side wall surfaces of the ILD layer 24A and on the exposed top surfaces of the barrier layer 28, the metal liner 30 and the metal fill layer 32. The cap/etch stop layer 38 may comprise, for example, silicon nitride (SiN), silicon carbide (SiC), silicon carbonitride (SiCN), hydrogenated silicon carbide (SiCH), silicon oxynitride (SiNO), silicon oxycarbide (SiOC), $AlO_x$, or other suitable material. The layer 38 may, for example, be a low-k silicon carbonitride material such as NBLOk™. This material comprises Si, C, O, H, and N, is marketed by Applied Materials, Inc., and can be deposited using PECVD. The layer 38 can have a vertical thickness ranging from about 1 nm to about 30 nm. The cap/etch stop layer may function as an air and/or metal diffusion barrier or insulator, and may be used to improve interconnect reliability. In some embodiments, the cap/etch stop layer 38 is a multi-layer stack made of one or more of the materials identified above. A structure 60 as schematically illustrated in FIG. 6 can be obtained following conformal deposition of the cap/etch stop layer.

Figure 7:
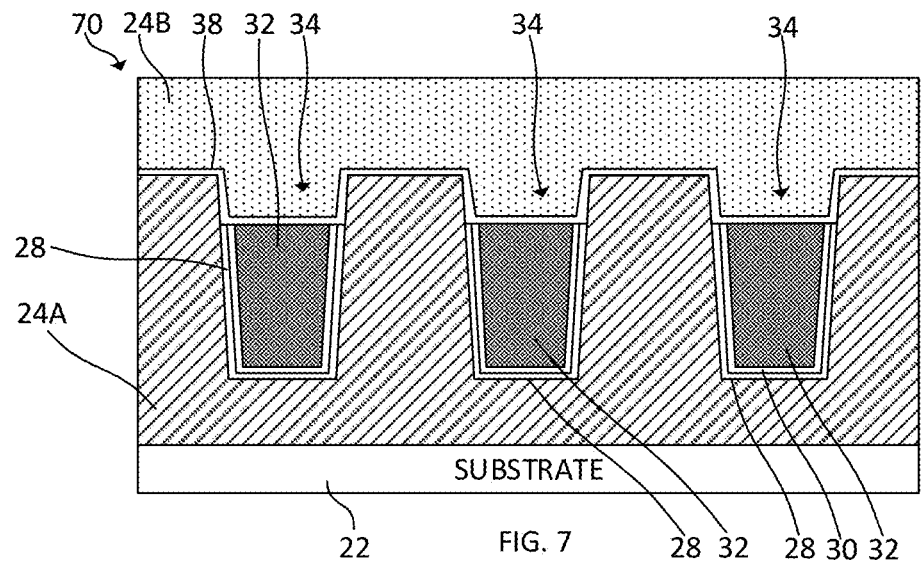
FIG. 7 is a schematic, cross-sectional view thereof following deposition of a further interlevel dielectric layer.

A second interlevel dielectric (ILD) layer 24B is deposited over the cap/etch stop layer 38 of the structure 60 to obtain a structure 70 as schematically illustrated in FIG. 7. The second ILD layer 24B, like the earlier deposited interlayer 24A, comprises a low-k dielectric material. Deposition processes for ILD layer 24B should have gap fill capability due to the underlying topography, e.g. ability to fill in the nanoscale trenches 34 above the recessed metal lines within the first ILD layer 24A. While the first ILD layer 24A may be formed using conformal deposition techniques, the deposition of flowable ILD material(s) is preferred for the second ILD layer 24B. In an exemplary embodiment, the underlying ILD layer 24A has superior TDDB properties than the subsequently deposited ILD layer 24B, though inferior gap filling properties. The low-k material with superior TDDB properties (ILD layer 24A) fills the relatively large gaps between the metal lines/vias while low-k material having different properties (ILD layer 24B) fills the nanoscopic trenches 34 and possibly other nanoscopic spaces within the ILD layer 24A. Either or both ILD layers 24A, 24B may comprise an ultra low-k (ULK) dielectric material having a dielectric constant of 2.5 or below. Octamethylcyclotetrasiloxane (OMCTS) is a precursor that may be used in the chemical vapor deposition of dielectric layers having good TDDB properties. The ILD layer 24A may alternatively be a SiCN or a $SiO_2$ layer having good TDDB properties, but relatively poor gap fill properties.

It will be appreciated that ILD layers having the same or similar chemical compositions do not necessarily have the same properties. Two such layers may have different porosities, different dielectric constants and/or different TDDB properties, depending for example on the deposition techniques employed. In accordance with one or more embodiments of the invention, the first and second ILD layers comprise the same chemical compositions but have different physical properties. In accordance with other embodiments of the invention, the first and second ILD layers comprise different chemical compositions having different physical properties, such as dielectric breakdown properties.

Examples of low-k materials suitable for the flowable dielectric material include organosilicate glass (OSG), fluorine doped silicon dioxide, carbon doped silicon dioxide, porous silicon dioxide, porous carbon doped silicon dioxide, spin-on organic polymeric dielectrics (e.g., SiLK®), spin-on silicone based polymeric dielectric (e.g., hydrogen silsesquioxane (HSQ) and methylsilsesquioxane (MSQ), and combinations thereof. SiLK® thermosetting polymer may, for example, be applied by spin coating and is planarized following curing. The flowable dielectric material may comprise spin-on glass (SOG) deposited using flowable chemical vapor deposition (FCVD). Spin on glass (SOG) compositions typically includes silicon oxide ($SiO_2$) and optionally dopants (either boron or phosphorous). SOG may be applied by spin-coating. Spin-coating is a process used to coat the deposition surface with material which is originally in the liquid form, wherein the liquid is dispensed onto the deposition surface in predetermined amount, and the wafer is rapidly rotated. For example, the deposition surface, e.g., substrate, may be rotated, i.e., spun, to speeds as great as 6,000 rpm. During spinning, liquid is uniformly distributed on the surface by centrifugal forces. The deposited material may then be solidified by a low temperature bake, e.g., baking at temperatures less than 200° C. A further exemplary low-k material with good gap fill properties is described in U.S. Pat. No. 9,412,581.

Figure 8:
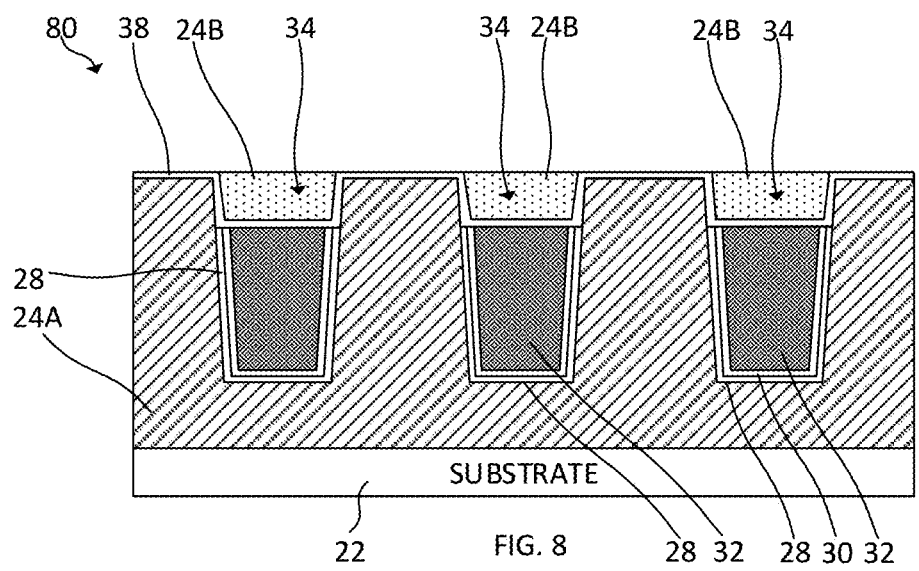
FIG. 8 is a schematic, cross-sectional view thereof following planarization of the further interlevel dielectric layer.

A flowable dielectric film can also include dielectric films that are formed from vapor-phase reactants and are flowable during deposition such as flowable chemical vapor deposition (FCVD). A substantially carbon free silicon oxide ($SiO_2$) material can, for example, be deposited using FCVD. Flowable chemical vapor deposition (FCVD) provides for a liquid-like film that flows freely into trench-like geometries to provide a bottom up, void-free and seam-free fill. Flowable chemical vapor deposition can fill gaps having relatively high aspect ratios exceeding 10:1. One example of a flowable chemical vapor deposition process is available from Applied Materials under the tradename Eterna FCVD system. Following deposition of the second dielectric material having good fill properties and possible curing, the resulting structure is then subjected to chemical mechanical planarization (CMP) down to the top surfaces of the cap/etch top layer 38 to obtain a structure 80 as schematically illustrated in FIG. 8. The top surfaces of the second ILD layer 24B comprising the second dielectric material are coplanar with the exposed top surfaces of the cap/etch stop layer and completely fill the relatively shallow trenches 34 above the metal lines formed by the metal fill layer 32.

Figure 9:
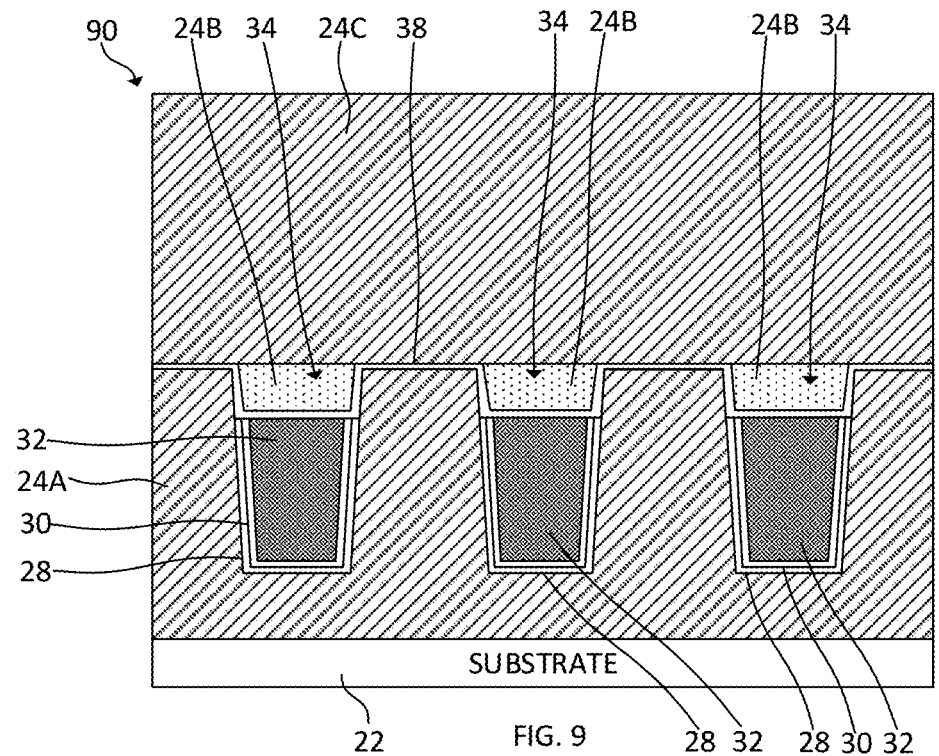
FIG. 9 is a schematic, cross-sectional view thereof following deposition of an additional interlevel dielectric layer.

A third ILD layer 24C is deposited on the structure 80 shown in FIG. 8. The third dielectric layer 24C may have the same composition as the first-deposited ILD layer 24A and be deposited using the same or similar techniques. The third dielectric layer 24C may include multiple dielectric layers. In one or more embodiments, the third dielectric layer 24C has good dielectric breakdown (TDDB) properties and is not used to fill nanoscopic spaces. It accordingly may not have the same filling capabilities as the second dielectric layer 24B. As shown in FIG. 9, the third dielectric layer adjoins the top surfaces of the second ILD layer 24B as well as the top surfaces of the cap/etch stop layer 38 that extend between portions of the second ILD layer 24B. Dual damascene patterning of the third ILD layer 24C is employed to form the exemplary structure 100 illustrated in FIG. 10.

As known in the art, dual damascene patterning involves the deposition and patterning of hard masks (not shown) on the dielectric layer to be patterned. A trench pattern can be etched into one hard mask and a via pattern can be formed in another hard mask. The via pattern is aligned with selected portions of underlying metal lines to facilitate formation of fully aligned vias (FAVs). Using one of the hard masks, a selective etching technique is employed to form vias 42 extending vertically through selected portions of the third dielectric layer 24C. Trenches 44 in the third dielectric layer 24C are formed using the other of the hard masks. The bottom portions of the trenches adjoin the top openings of the vias. A dry etch (for example, a reactive ion etch) may be employed to form such trenches and vias. The etching selectively removes portions of the ILD layer 24C. The depth(s) of the trench openings can be controlled by using a timed etching process. The selective etch further removes portions of the second ILD layer 24B over the metal fill layer, causing the vias 42 to extend down to the cap/etch stop layer 38 on the contact portions of the metal fill layer 32. The vias 42 may have diameters that exceed the widths of the trenches 34 and have bottom regions terminating at exposed, horizontal portions of the cap/etch stop layer 38 adjoining the open top ends of the shallow trenches 34 above the recessed metal. Other portions of the second ILD layer 24B are protected by the third ILD layer 24C and remain in the nanoscopic areas of the structure following dual damascene processing.

Figure 10:
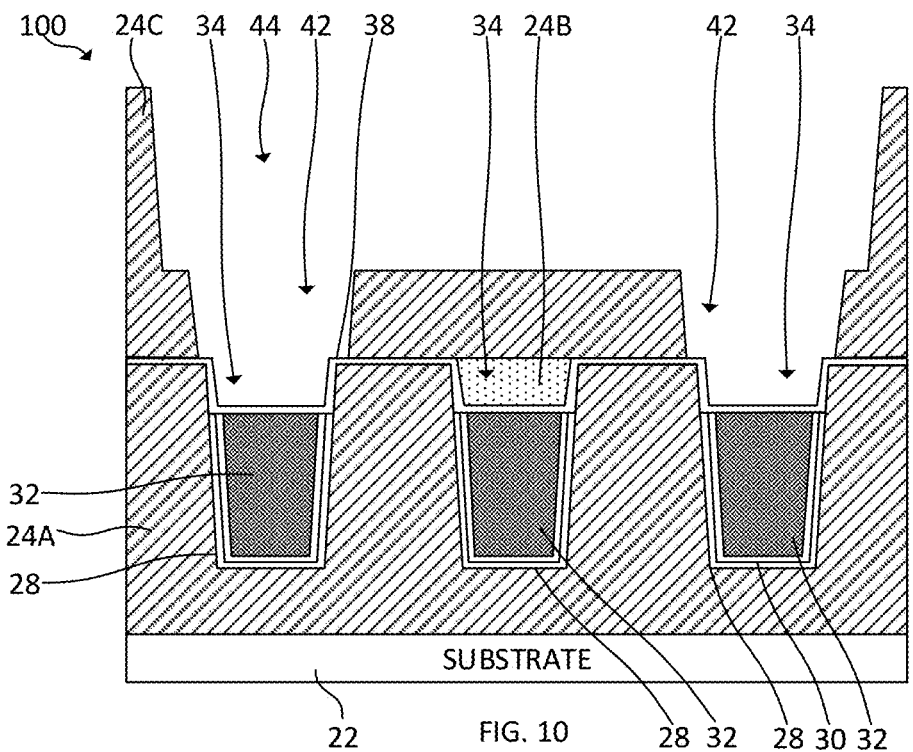
FIG. 10 is a schematic, cross-sectional view thereof following dual damascene patterning of the additional dielectric layer.

Referring to FIG. 10, vertically extending vias 42 within the third dielectric layer 24C adjoin portions of the shallow trenches 34 above the cap/etch stop layer 38 on two of the three illustrated metal lines recessed within the first dielectric layer 24A. The second (e.g. flowable) dielectric material has been removed from the portions of the two illustrated shallow trenches 34 that adjoin the bottom ends of the vias 42. Portions of the second dielectric layer 24B remain in other portions of the two shallow trenches 34. The vias 42 and portions of the trenches 34 from which dielectric material has been removed form contiguous pathways from the trench in the third dielectric layer 24C.

Referring again to FIG. 10, the shallow trench 34 above the metal line in the middle of the exemplary structure 100 is filled by material within the second ILD layer 24B. There is no via connecting the illustrated trench to this metal line. It will be appreciated that the structure 100 may include additional trenches (not shown) and one or more vias extending down to the shallow trench 34 above the metal line in the middle of the structure 100. Dielectric material within the second ILD layer 24B would then be removed from regions of the middle trench 34 that do not appear in the cross sectional view of the illustration. The trench(es) 44 within the third ILD layer 24C extends perpendicularly with respect to the shallow trenches 34 in the first dielectric layer 24A and intersects the vertically extending vias 42 therein. The vias 42 connect the trenches 44, 34.

Figure 11:
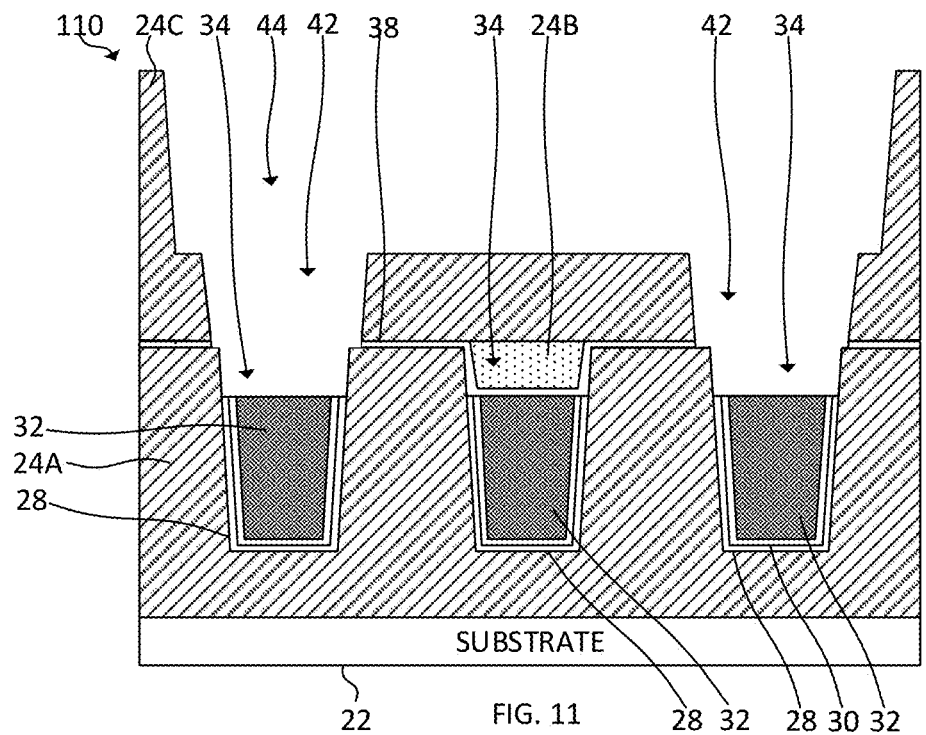
FIG. 11 is a schematic, cross-sectional view thereof following etching of the conformal, dielectric cap/etch stop layer.

Following dual damascene patterning of the third ILD layer 24C, the exposed portions of the cap/etch stop layer 38 are removed using a selective etch process. In embodiments wherein a silicon nitride cap/etch stop layer is employed, it can be selectively removed using hot $H_3PO_4$ wet chemistry or other suitable process. A structure 110 as schematically illustrated in FIG. 11 can be obtained upon the selective removal of portions of the cap/etch stop layer 38. The top surfaces of portions of the metal lines that are vertically aligned with the vias 42 are exposed following cap/etch stop layer removal therefrom. The bottom ends of the vias 42 within the third ILD layer 24C also adjoin portions of the top surfaces of the first ILD layer 24A following the partial removal of the cap/etch stop layer 38.

Figure 12:
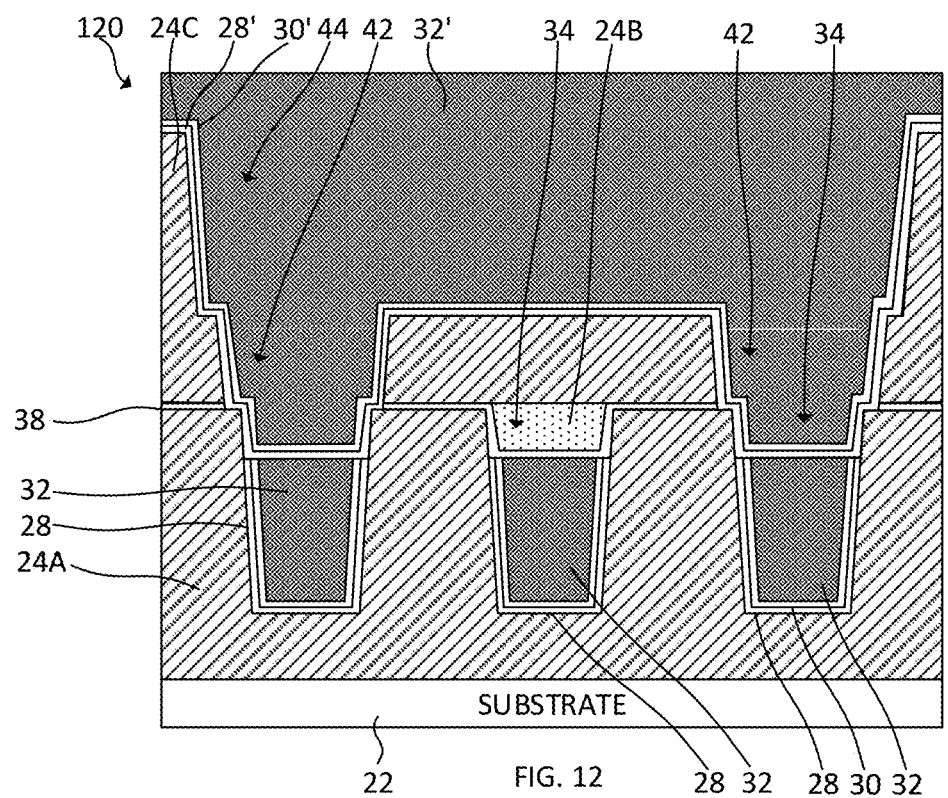
FIG. 12 is a schematic, cross-sectional view thereof following deposition of a barrier, a metal liner and metal filler on the patterned additional dielectric layer.

A further stage in the fabrication process includes depositing conformal, conductive layers of barrier and liner material to form a barrier layer 28' and an electrically conductive liner 30'. In some embodiments, the barrier layer 28' and the liner 30' comprise, respectively, the same materials as the previously formed barrier layer 28 and liner 30 within the first ILD layer 24A. The barrier layer 28' lines the sidewalls and bottom surfaces of the trenches 44, the vias 42 and possibly other openings (not shown) within the third ILD layer 24C. It further directly contacts the exposed surfaces of the metal fill 32 (or the optional cap 36 as discussed with respect to FIG. 5). The metal liner material 30' is deposited using known techniques such as CVD, ALD, or PVD directly on the barrier layer 28'. A thin copper (Cu) seed layer can be deposited over the surface of the metal liner 30' using PVD, followed by the electroplating of Cu to fill the dual damascene openings (trenches 44, vias 42) in the third ILD layer 24C and the portions of the shallow trenches 34 in the first ILD layer 24A that are vertically aligned with the vias 42. A low-temperature thermal anneal (<200° C.) follows electroplating. A structure 120 as schematically illustrated in FIG. 12 may be obtained following deposition of the interconnect metal fill layer 32'. The vias 42 containing the metal fill layer 32' are fully aligned vias (FAVs) electrically connected to selected metal lines within the underlying ILD layer 24A.

Figure 13:
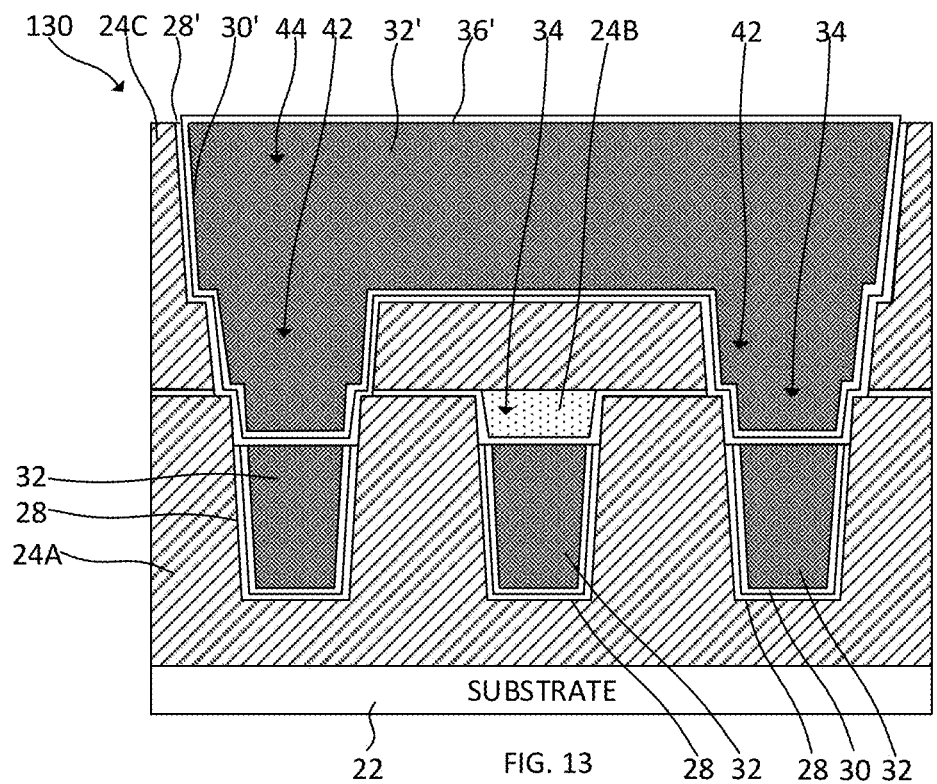
FIG. 13 is a schematic, cross-sectional view thereof following planarization of the barrier, metal liner and metal fill layer and deposition of a metal cap.

The overburden barrier layer, metal liner, seed, and metallization materials are removed by a chemical mechanical polishing process (CMP) to planarize the surface of the structure down to the top surface of the third ILD layer 24C. Metal interconnect lines are thereby formed within the trenches 44 of the third ILD layer 24C. The metal interconnect lines within the trenches 44 of the third ILD layer 24C run perpendicularly to the underlying metal interconnect lines within the trenches 26 of first ILD layer 24A and are electrically connected to one or more of them by the metal within the vias 42. A metal cap layer 36' may be selectively deposited on the exposed top surfaces of the metal interconnect lines formed within the trenches 44 from the interconnect metal fill layer 32'. For example, metals including, but not limited to, cobalt, ruthenium or manganese may be deposited using chemical vapor deposition or atomic layer deposition to form the metal cap layer 36'. In some embodiments, the metal cap layer comprises materials immiscible with liquid copper such as Ta or Ru. Post-deposition cleaning may be required to ensure there is no leakage or degradation resulting from possible metal residues on the resulting structure. FIG. 13 schematically illustrates an exemplary structure 130 following planarization and metal cap deposition. It will be appreciated that additional interconnect layers (not shown) may be formed on the structure 130 using damascene or dual damascene techniques. Each of the additional interconnect layers may include dielectric layers including different properties, one dielectric layer having good fill properties for filling nanoscopic trenches or other nanoscopic areas and another having superior dielectric reliability.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* $1^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, a method of forming an interconnect layer over a semiconductor substrate includes obtaining a bottom structure such at that schematically illustrated in FIG. 3. The bottom structure includes a first dielectric layer 24A comprising a first low-k dielectric material above the semiconductor substrate 22 and a metal fill layer 32 comprising metal lines within the first dielectric layer. The metal lines are recessed, thereby forming open-ended trenches 34 within the first dielectric layer 24A and directly above the metal lines, as shown in FIG. 4. The open-ended trenches are filled with a second low-k dielectric material to ultimately obtain a structure 80 as schematically illustrated in FIG. 8. The second low-k dielectric material and the first low-k dielectric material have one or more different physical properties. For example, the first dielectric material preferably has good dielectric breakdown properties. The second dielectric material comprising a second ILD layer 24B preferably has good filling capabilities that allow it to fill trenches having nanoscopic dimensions without voids or creases. The filling capability of the first dielectric material may not be as good as the second low-k dielectric material as reliability takes precedence over trench filling capability in the first dielectric layer.

The method further includes depositing a top dielectric (ILD) layer 24C over the bottom structure and patterning the top dielectric layer, thereby forming one or more top trenches 44 within the top dielectric layer and one or more vias 42 extending downwardly from each of the one or more top trenches. The vias 42 are vertically aligned with one or more portions of the open-ended trenches 34 and the metal lines in the first dielectric layer 24A, as schematically illustrated in FIG. 10. The second low-k dielectric material of the second ILD layer 24B is removed from the one or more portions of the open-ended trenches 34 that are vertically aligned with the one or more vias 42. As shown in FIGS. 10 and 11, portions of the trenches 34 remain filled with the second dielectric material while the metal lines are exposed in locations where the portions of the second dielectric material have been removed. Interconnect metal 32' is deposited within the one or more top trenches 44, the one or more vias 42, and the one or more portions of the open-ended trenches 34 aligned with the vias 42. The interconnect metal within the vias 42 electrically connects metal lines within the first and third dielectric (ILD) layers 24A, 24C. As shown in FIG. 13, the regions between the metal lines and between the vias 42 is mostly dielectric material within the first and third ILD layers 24A, 24B. As filling capability is not necessarily a priority in these layers, low-k dielectric materials having relatively good TDDB or other physical properties can be employed. The reliability of the interconnect layers can accordingly be enhanced. The relatively small regions filled by the second ILD layer 24B, which may not have TDDB properties as good as the first and third ILD layers 24A, 24C, should not materially impair reliability of the interconnect structures. A flowable CVD process may, for example, be employed to form the second ILD layer 24B other processes that do not involve flowing dielectric material can be employed to form the first and third ILD layers 24A, 24C.

Electronic structures obtained in accordance with the principles of the inventions described herein include a semiconductor substrate 22, a first dielectric layer 24A over the semiconductor substrate and comprising a first low-k dielectric material, metal lines recessed within the first dielectric layer, and a plurality of open-ended trenches 24 extending, respectively, within the first dielectric layer 24A and directly above the metal lines. As discussed above, the metal lines are formed from a metal fill layer 32. A second low-k dielectric material (ILD layer 24B) fills one or more portions of the plurality of open-ended trenches 34. The second low-k dielectric material and the first low-k dielectric material have one or more different physical properties such as TDDB properties and/or porosity. A dual damascene patterned third dielectric layer 24C extends over the first dielectric layer and includes vertically extending vias 42 aligned with one or more of the recessed metal lines in the first dielectric layer 24A. A metal interconnect layer 32' within the third dielectric layer extends through the vertically extending vias 42 and is electrically connected to one or more of the recessed metal lines below. An exemplary electronic structure 130 is illustrated in FIG. 13. Portions of the second dielectric material of the second ILD layer 24B are between top portions of the metal lines and the third dielectric layer 24C. A conformal dielectric cap/etch stop layer 38 extends between and adjoins the first dielectric layer 24A and the third dielectric layer 24C and further extends between at least one of the metal lines and the second dielectric material.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having structures including interconnects and associated structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of forming an interconnect layer over a semiconductor substrate, comprising:
    obtaining a bottom structure including:
        a first dielectric layer comprising a first low-k dielectric material above the semiconductor substrate; and
        metal lines within the first dielectric layer;
    recessing the metal lines, thereby forming open-ended trenches within the first dielectric layer and directly above the metal lines;
    depositing a conformal cap/etch stop layer over the first dielectric layer and the metal lines;
    filling the open-ended trenches with a second low-k dielectric material, the second low-k dielectric material and the first low-k dielectric material having one or more different physical properties, wherein filling the open-ended trenches with the second low-k dielectric material comprises depositing a second dielectric layer over the conformal cap/etch stop layer;
    depositing a top dielectric layer over the bottom structure;
    patterning the top dielectric layer, thereby forming one or more top trenches within the top dielectric layer and one or more vias extending downwardly from each of the one or more top trenches, the one or more vias being vertically aligned with one or more portions of the open-ended trenches;
    removing the second low-k dielectric material from the one or more portions of the open-ended trenches vertically aligned with the one or more vias; and
    depositing interconnect metal within the one or more top trenches, the one or more vias, and the one or more portions of the open-ended trenches, the interconnect metal within the one or more vias being electrically connected to one or more of the metal lines.

2. The method of claim 1, further including:
    removing portions of the conformal cap/etch stop layer over the metal lines following removing the second low-k dielectric material from the portions of the one or more of the open-ended trenches.

3. The method of claim 2, wherein the second low-k dielectric material is flowable during filling the open-ended trenches and depositing the second dielectric layer comprises flowing the second low-k dielectric material into the open-ended trenches.

4. The method of claim 3, wherein the open-ended trenches each have an average width of fifty nanometers or less.

5. The method of claim 4, wherein the one or more physical properties comprises time dependent dielectric breakdown (TDDB), and further wherein first low-k dielectric material has superior time dependent dielectric breakdown (TDDB) properties than the second low-k dielectric material.

6. The method of claim 5, wherein filling the open-ended trenches comprises spin coating the second low-k dielectric material.

7. The method of claim 6, wherein obtaining the bottom structure comprises depositing the first low-k dielectric material over the substrate using chemical vapor deposition (CVD), plasma enhanced CVD (PECVD), or radio-frequency CVD (RFCVD).

8. The method of claim 5, wherein filling the open-ended trenches comprises depositing the second low-k dielectric material using flowable chemical vapor deposition.

9. The method of claim 8, wherein obtaining the bottom structure comprises depositing the first low-k dielectric material over the substrate using chemical vapor deposition (CVD), plasma enhanced CVD (PECVD), or radio-frequency CVD (RFCVD).

10. A method of fabricating an interconnect layer, comprising:
    recessing a plurality of metal lines within a first dielectric layer comprising a first low-k dielectric material, thereby forming recessed metal lines and a plurality of open-ended trenches extending, respectively, within the first dielectric layer above the metal lines;
    conformally depositing a dielectric cap/etch stop layer over the first dielectric layer and the recessed metal lines;
    flowing a second low-k dielectric material over the dielectric cap/etch stop layer, thereby forming a second dielectric layer filling the open-ended trenches, the second low-k dielectric material being a flowable dielectric, the second low-k dielectric material and the first low-k dielectric material having one or more different physical properties;

planarizing the second dielectric layer, thereby removing the second dielectric material above the open-ended trenches;

depositing a third dielectric layer over the second dielectric layer and the cap/etch stop layer;

dual damascene patterning the third dielectric layer, thereby forming one or more top trenches and vias extending downwardly from the one or more top trenches;

removing portions of the second dielectric layer beneath the vias;

removing one or more portions of the dielectric cap/etch stop layer beneath the vias; and depositing interconnect metal within the one or more top trenches, the vias, and one or more of the open-ended trenches, the interconnect metal being electrically connected to one or more of the recessed metal lines.

11. The method of claim 10, wherein the first low-k dielectric material and the second low-k dielectric material have different chemical compositions.

12. The method of claim 10, wherein the one or more different physical properties comprises time dependent dielectric breakdown (TDDB), the first low-k dielectric material having superior time dependent dielectric breakdown (TDDB) properties than the second low-k dieelectric material.

13. The method of claim 12, wherein the third dielectric layer comprises a third low-k dielectric material having superior time dependent dielectric breakdown (TDDB) properties than the second low-k dielectric material.

14. A method of forming an interconnect layer over a semiconductor substrate, comprising:

obtaining a bottom structure including:
a first dielectric layer comprising a first low-k dielectric material above the semiconductor substrate; and
metal lines within the first dielectric layer;

recessing the metal lines, thereby forming open-ended trenches within the first dielectric layer and directly above the metal lines;

flowing a second low-k dielectric material into the open-ended trenches, the second low-k dielectric material and the first low-k dielectric material having one or more different physical properties;

planarizing the second low-k dielectric material;

depositing a top dielectric layer over the bottom structure, the top dielectric layer and the second low-k dielectric material in the open-ended trenches having one or more different physical properties;

patterning the top dielectric layer, thereby forming one or more top trenches within the top dielectric layer and one or more vias extending downwardly from each of the one or more top trenches, the one or more vias being vertically aligned with one or more portions of the open-ended trenches;

removing the second low-k dielectric material from the one or more portions of the open-ended trenches vertically aligned with the one or more vias; and depositing interconnect metal within the one or more top trenches, the one or more vias, and the one or more portions of the open-ended trenches, the interconnect metal within the one or more vias being electrically connected to one or more of the metal lines.

* * * * *